United States Patent [19]
Janesch et al.

[11] Patent Number: 6,018,556
[45] Date of Patent: Jan. 25, 2000

[54] PROGRAMMABLE LOOP FILTER FOR CARRIER RECOVERY IN A RADIO RECEIVER

[75] Inventors: Stephen T. Janesch; Paul Schnizlein, both of Austin, Tex.

[73] Assignee: DSP Group, Inc., Santa Clara, Calif.

[21] Appl. No.: 08/968,028

[22] Filed: Nov. 12, 1997

Related U.S. Application Data

[60] Provisional application No. 60/031,350, Nov. 21, 1996.

[51] Int. Cl.$^7$ ....................................................... H03D 3/24
[52] U.S. Cl. ........................... 375/376; 375/326; 375/327
[58] Field of Search ................................... 375/324, 325, 375/326, 327, 328, 373, 376, 350, 345, 374, 375; 327/141, 156

[56] References Cited

U.S. PATENT DOCUMENTS

| | | |
|---|---|---|
| 4,243,941 | 1/1981 | Zdunek . |
| 4,360,788 | 11/1982 | Erps et al. ................................... 331/1 |
| 5,861,842 | 1/1999 | Hitch et al. .............................. 342/357 |
| 5,881,110 | 3/1999 | Cochran ................................... 375/324 |

FOREIGN PATENT DOCUMENTS

| | | |
|---|---|---|
| 0 590 323 A1 | 4/1994 | European Pat. Off. . |
| 002062128 | 6/1987 | Japan . |
| WO 96/12361 | 4/1996 | WIPO . |

OTHER PUBLICATIONS

International Search Report for PCT/US97/21469 dated Apr. 27, 1998.

Hansen, et al, "VLSI Digital PSK Demodulator for Space Communication," 100 European Transactions on Telecommunications and Related Technologies 4(1993) Jan./Feb., No. 1, Milano, IT, pp. 43–52.

Uchishima, et al, "Burst DSP Demodulator For Low EB/N0 Operation," Fujitsu Laboratories Ltd., pp. 226–230, Japan, 1991.

XP–002062128 Serizawa, et al, "An Adaptive Carrier Tracking Loop For Digital Satellite Mobile Communications," Research and Development Center, Toshiba Corporation, IEEE Publication, Jun. 7, 1987, pp. 1754–1760.

Sklar, B., "*Digital Communications; Fundamentals and Applications*," PTR Prentice Hall, Englewood Cliffs, New Jersey, 1988, pp. 552.

Gardner, F., "*Phaselock Techniques*" Second Edition, John Wiley & Sons, New York, 1979, pp. 165, 175 and 194.

*Primary Examiner*—Chi H. Pham
*Assistant Examiner*—Jean B Corrielus
*Attorney, Agent, or Firm*—Conley, Rose & Tayon; Jeffrey C. Hood; Cyrus F. Bharucha

[57] ABSTRACT

A digital loop filter in the carrier-recovery loop of a digital communications receiver. The recovery loop is a PLL that keeps the receiver oscillator locked to the carrier wave, and the loop filter provides control over the PLL's frequency response by conditioning an error signal that is fed back to the receiver oscillator. In the present invention, the error signal is a digital signal, and the loop filter is implemented in digital hardware. With this implementation the characteristics of the loop filter are determined by logic design rather than by physical features of analog components, thereby giving this filter a more precise function than one with analog integrators. This implementation is also immune to the low tolerances typical of the manufacturing process for analog devices (especially on monolithic circuits), and is more easily adjusted than its analog counterparts. Two gain coefficients characterize the loop filter in the present invention. These gain coefficients are chosen to be powers of two, simplifying the process of multiplying them with the digital error signal. The gain coefficients are read from a memory, making the loop filter easily programmable. By changing the gain coefficients during operation of the receiver, the carrier-recovery loop can be placed in one of the several operating modes, including acquisition, tracking, and hold. The receiver can be configured with the appropriate values of the gain coefficients for each operating mode during the initial assembly and during subsequent reconfigurations.

33 Claims, 7 Drawing Sheets

PROGRAMMABLE LOOP FILTER FOR CARRIER RECOVERY IN A RADIO RECEIVER

This application claims the benefit of priority of U.S. Provisional Application No. 60/031,350, titled "Spread Spectrum Cordless Telephone System and Method" and filed Nov. 21, 1996.

BACKGROUND OF THE INVENTION

1. Field of the Invention

The invention relates to electronic communication and, more particularly, to a loop filter in the carrier-recovery loop of a radio receiver.

2. Description of the Related Art

Radio transmission and reception is accomplished through a carrier wave that is modulated to bear the transmitted information. The transmission of the data involves modulating the carrier with a baseband signal that represents the information to be transmitted. Typically, the carrier wave is generated by a reference oscillator in a transmitter unit and modulated by a modulator to produce the transmitted signal. After traversing a communication channel, this signal is received by a receiver unit that demodulates it to extract the baseband signal.

An important component of the receiver unit is a local oscillator that is used to demodulate the received signal. This oscillator must match the frequency of the transmitter oscillator that generated the carrier wave: if the frequencies of the two oscillators are not matched, the receiver cannot efficiently demodulate the transmitted signal. The receiver oscillator can be built so that its natural frequency is close to that of the transmitter oscillator, but due to variations in manufacturing and differences in operating environments there will be drifts between the two oscillators. To compensate for such offsets in frequency between the carrier wave and the receiver oscillator, the receiver oscillator can be locked to the carrier wave by incorporating it into a phase-locked loop (PLL). Such a PLL serves as a carrier-recovery loop that ties the frequency of the receiver oscillator to the frequency of the transmitter oscillator.

In addition to the receiver oscillator, the carrier-recovery loop includes a phase detector and a loop filter. The phase detector generates an error signal to represent the difference in phase between the receiver oscillator and the carrier wave. Since the original carrier wave is not typically available to the receiver unit, the phase detector must be able to extract the frequency of the carrier wave from the received signal. That is, it must be able to ignore variations in the received signal's phase that are due to the information encoded onto the carrier. For example, in the case of a digital communication system using differential-quadriphase-shift-keying (DQPSK) modulation, changes in the phase of the carrier by multiples of 90° must not be interpreted as a drift in the receiver oscillator's phase. Depending on the type of modulation, there are several established methods of making the phase detector in the carrier-recovery loop insensitive to the phase shifts due to data-bearing modulation.

The loop filter in the carrier-recovery loop receives the error signal from the phase detector. The error signal is filtered in the loop filter into a feedback signal. The feedback signal is then used to adjust the frequency of the receiver oscillator so that it tracks the frequency of the received signal. The filtering typically includes a low-pass filtering characterized by several gain coefficients that determine the speed and sensitivity of the PLL. Large gain coefficients lead to a fast PLL, which reduces the time lag for the receiver oscillator to track the carrier wave. However, with the faster PLL comes a reduced robustness of the lock: a faster PLL is more susceptible to having its oscillator's phase shifted out of lock by noise in the received signal. Once the lock is lost it can be reacquired, but it may have a phase error (of $2n\pi$) called a cycle-slip.

Since a fast PLL and a low incidence of cycle-slips are both desirable qualities, the desirable values for the gain coefficients are trade-offs between speed and robustness. 5 There are several factors that determine the desired values of the gain coefficients. In qualitative terms, high gain coefficients (leading to a fast PLL) are appropriate if the received signal has a stable, slowly varying frequency that is close to the frequency of the receiver oscillator. This is the case for low-noise transmissions when the receiver oscillator is already locked to a good received signal. For these signals, a fast PLL keeps the receiver oscillator tightly locked to the received signal. There is, however, an upper limit on the speed of the PLL because the faster its response, the more susceptible it is to cycle slips. In general, lower PLL speeds are required for noisier received signals.

The gain coefficients also need to be adjusted as the recovery loop switches between different operating modes. The previously described tradeoff between PLL speed is and sensitivity to noise applies when the PLL is tracking the received signal. There is an appropriate range of values for the gain coefficients in this tracking mode. Another mode of operation for the PLL is when it initially acquires a phase lock to a received signal. During this acquisition mode, higher values of the gain coefficients are necessary so that the receiver oscillator can quickly approach the frequency of the received signal. A third mode of operation is the hold mode, when the receiver oscillator is kept at a fixed frequency, ignoring the received signal. This mode is desirable, for example during temporary losses of the received signal during fades. In the hold mode, some or all of the gain coefficients are zeroed so that no new feedback is provided to the receiver oscillator.

The determination of the quantitative values for the gain coefficients depends on the amplitudes of the received signal, the noise in the received signal, and the hardware used in the implementation of the PLL. None of theses factors can be perfectly pre-determined. In addition it depends on the operating mode of the recovery loop. The received amplitudes and noise will vary with the conditions of the receiver's use, the hardware is subject to variations in manufacturing processes, and the recovery loop will switch between different modes during operation. Because of these variations, PLLs are generally made with an array of loop filters with different combinations of gain coefficients. The filter with the most appropriate gain coefficients is selected during operation of the receiver to place the recovery loop in an appropriate operating mode.

A loop filter typically generates an output that is a linear combination of two components: the input phase error signal and the time-integral of this input. Therefore, some form of an integrator is a standard component of the loop filter, and the integrator's time constant determines one of the filter's gain coefficients. The integrators are typically analog devices that rely on the physical properties and dimensions of their components to determine their outputs. These parameters can vary under different operating conditions, making the output a less controllable signal and introducing a limitation on the prior art carrier-recovery loops. The limited selection and low tolerance of these analog components in a filter circuit limit the flexibility and tolerance of the gain coefficients. Therefore, an improved loop filter is desired for a carrier-recovery loop with adjustable and well-defined gain coefficients.

SUMMARY OF THE INVENTION

The present invention comprises a loop filter for a carrier-recovery loop in the receiver of a communication system. In the present invention, the error signal generated by the phase detector and the feedback signal from the loop filter are both digital signals. Since both its input and output are digital, the loop filter of the present invention is implemented in digital hardware, which brings several advantages to the design.

Unlike integration performed by analog components on integrated circuits, digital integration is a precisely controllable function determined by logic design rather than the physical features of its components. Analog implementations of integrators suffer from low tolerances in the manufacturing process; this is especially true in monolithic integrated circuits. An analog integrator in one circuit may have a very different time constant than an integrator in another circuit manufactured by the same process. In contrast, all digital integrators produced by the same process will have essentially the same performance characteristics.

Another advantage of the invention is that digital integrators are more flexible than their analog counterparts. While an analog integrator requires a selection of reference resistors and/or capacitors to provide multiple time constants, a digital integrator can be easily programmed to change its function.

Two gain coefficients, designated k1 and k2, characterize the loop filter in the present invention. These gain coefficients determine the frequency response of the loop filter and the amplitude of its output. Explicitly, the output feedback signal is a sum of two components: the input error signal, multiplied by k1, and the integral of the input error signal, multiplied by k2. The two gain coefficients are chosen to be powers of two, simplifying the process of multiplying the digital error signal by them.

The loop filter reads gain coefficients k1 and k2 from a memory where they are stored; this arrangement makes the loop filter easily programmable since the values of the gain coefficients can be readily changed in the memory. By changing the gain coefficients during operation of the receiver, the recovery loop can be selectively placed in one of the several operating modes, including tracking, acquisition, and hold. The receiver can be configured with the appropriate values of the gain coefficients for each operating mode during the initial assembly and during subsequent reconfigurations.

While being simple in design and implementation, this system is a flexible filter that is adaptable to a range of receiver designs and constructions, and tolerant of a range of amplitudes for the received signal. The present invention thus provides a significant improvement and advance in the art and technology of carrier-recovery loop filters.

BRIEF DESCRIPTION OF THE DRAWINGS

Other objects and advantages of the invention will become apparent upon reading the following detailed description and upon reference to the accompanying drawings in which.

DESCRIPTION OF THE PREFERRED EMBODIMENTS

The following patents and patent applications are hereby incorporated by reference in their entirety as though fully and completely set forth herein:

U.S. Provisional Application No. 60/031350 titled "Spread Spectrum Cordless Telephone System and Method" and filed Nov. 21, 1996, whose inventors are Alan Hendrickson, Paul Schnizlein, Stephen T. Janesch, and Ed Bell;

U.S. Application Ser. No. 08/975,142, titled "Passband DQPSK detector for a Digital Communications Receiver Front End" and filed Nov. 20, 1997, whose inventors are Alan Hendrickson and Paul Schnizlein;

U.S. Application Ser. No. 08/968,202, titled "An Improved Phase Detector for Carrier Recovery in a DQPSK Receiver" and filed Nov. 12, 1997, whose inventors are Stephen T. Janesch, Alan Hendrickson, and Paul Schnizlein;

U.S. Application Ser. No. 09/078,225, titled "Symbol-Quality Evaluation in a Digital Communications Receiver" and filed May 13, 1998, whose inventor is Alan Hendrickson;

U.S. Application Ser. No. 08/968,029, titled "A Carrier-Recovery Loop with Stored Initialization in a Radio Receiver" and filed Nov. 12, 1997, whose inventors are Stephen T. Janesch, Paul Schnizlein, and Ed Bell; and U.S. Application Ser. No. 09/078,145, titled "A Method for Compensating Filtering Delays in a Spread-Spectrum Receiver" and filed May 13, 1998, whose inventor is Alan Hendrickson, now U.S. Pat. No. 5,940,435.

Digital Communication System

Figure 1:
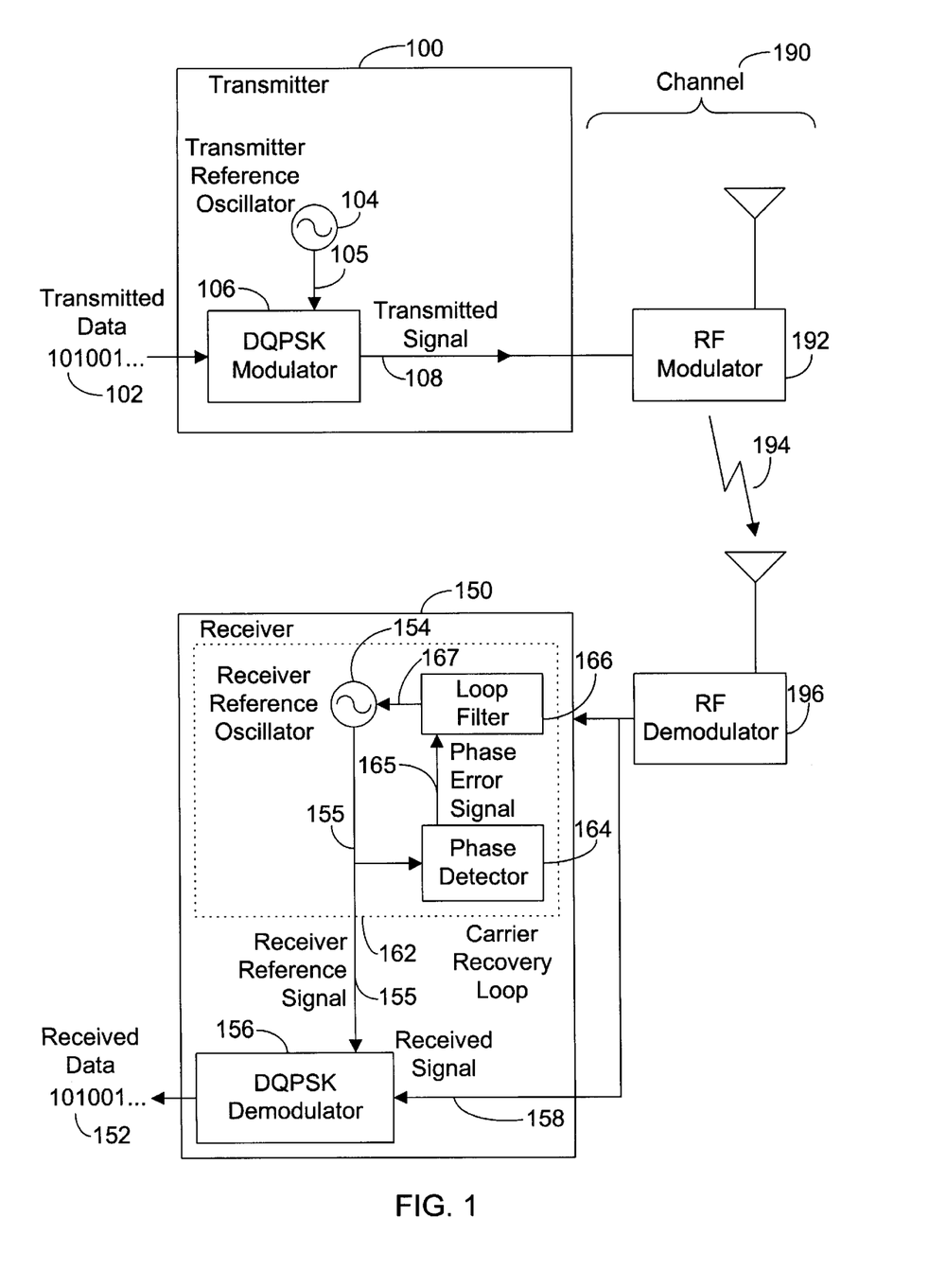
FIG. 1 is a schematic view of a telecommunication system.

As shown in FIG. 1, a digital communication system comprises at least one transmitter 100 and one receiver 150 for the communication of data. Such communication systems are well known in the art. The system described in this figure uses differential quadriphase-shift keying (DQPSK) to convey data from a transmitter to a receiver. Although not depicted here, other modulation schemes such as ASK, FSK, and other variants of PSK could also be used to convey the data.

In the transmitter 100, digital data 102 are provided to a modulator 106. A transmitter reference oscillator 104 generates a sinusoidal carrier wave 105 for the modulator 106. The digital data 102 are encoded onto the sinusoidal carrier wave 105 by the modulator 106 which shifts the carrier's phase by multiples of 90° according to the technique of DQPSK modulation, a technique well-known in the art. In this technique, the modulator 106 shifts the phase of the carrier wave by multiples of 90° to generate a transmitted signal 108; these phase shifts are the symbols that encode the data. Each symbol lasts for a duration of time T after which the next phase shift is introduced to the carrier. The differences in phase angle between successive symbols represent the transmitted data 102. Since there are four possible symbols (shifts of 0°, 90°, 180°, or 270°) in QPSK modulation, each phase difference represents two bits of the transmitted data.

The carrier wave's frequency is determined by the reference oscillator 104 in the transmitter. The transmitted signal 108 is the sinusoidal carrier wave with the data-bearing phase shifts of duration T. The transmitted signal 108 is sent via a physical commnunication channel 190 to the receiver 150.

The channel depicted in this figure is a radio transmission system that modulates the transmitted signal onto a radio wave 194 with a frequency greater than the carrier wave frequency. The channel 190 depicted here comprises the radio-frequency (RF) modulator 192, the radio wave 194 transmitted through the air, and the RF demodulator 196. As would be known to one skilled in the art, other communications channels such as transmission line, waveguide, or optical fiber systems can of course be used instead of (or in conjunction with) the depicted radio transmission system. Under ideal conditions the received signal 158 would be an exact replica of the transmitted signal 108. In practice, however, there may be some differences between these two signals due to degradation suffered in the communication channel.

In the receiver 150, the received signal is demodulated by a demodulator 156 to extract the received data 152. Ideally, the received digital data 152 would replicate the transmitted digital data 102, but in practice the two sets of data may differ due to decoding errors in the receiver, or degradation of the transmitted signal in the communications channel.

Carrier Recovery

To extract the data from the received signal, the demodulator 156 requires a reference signal that closely reproduces the carrier wave 105. Since the original carrier wave 105 is not usually available in the receiver unit, this reference 155 is generated by a reference oscillator 154 in the receiver. In a preferred embodiment of the receiver, the reference oscillator 154 is a digitally controlled oscillator (DCO); that is, it accepts a digital input word that controls the frequency of the oscillator's output. This oscillator 154 must match the frequency of the transmitter oscillator 104 that generated the carrier wave 105: if the frequencies of the two oscillators are not matched, the receiver unit 150 cannot efficiently demodulate the transmitted signal. The receiver oscillator 154 can be built so that its natural frequency is close to that of the transmitter oscillator 104, but due to variations in manufacturing and differences in operating environments there will be drifts between the two oscillators. To compensate for such offsets in frequency between the carrier wave and the receiver oscillator, the receiver oscillator is locked to the carrier wave by incorporating it into phase-locked loop (PLL). The PLL is a carrier-recovery loop 162 that ties the frequency of the receiver oscillator 154 to the frequency of the transmitter oscillator 104. The feedback from the carrier-recovery loop 162 corrects offsets between the frequencies of the receiver oscillator and the carrier.

The depiction of the receiver in FIG. 1 includes a basic block diagram of the carrier-recovery loop 162. The carrier-recovery loop 162 includes the basic elements of a PLL: the receiver oscillator 154, a phase detector 164, and the loop filter 166.

Figure 2:
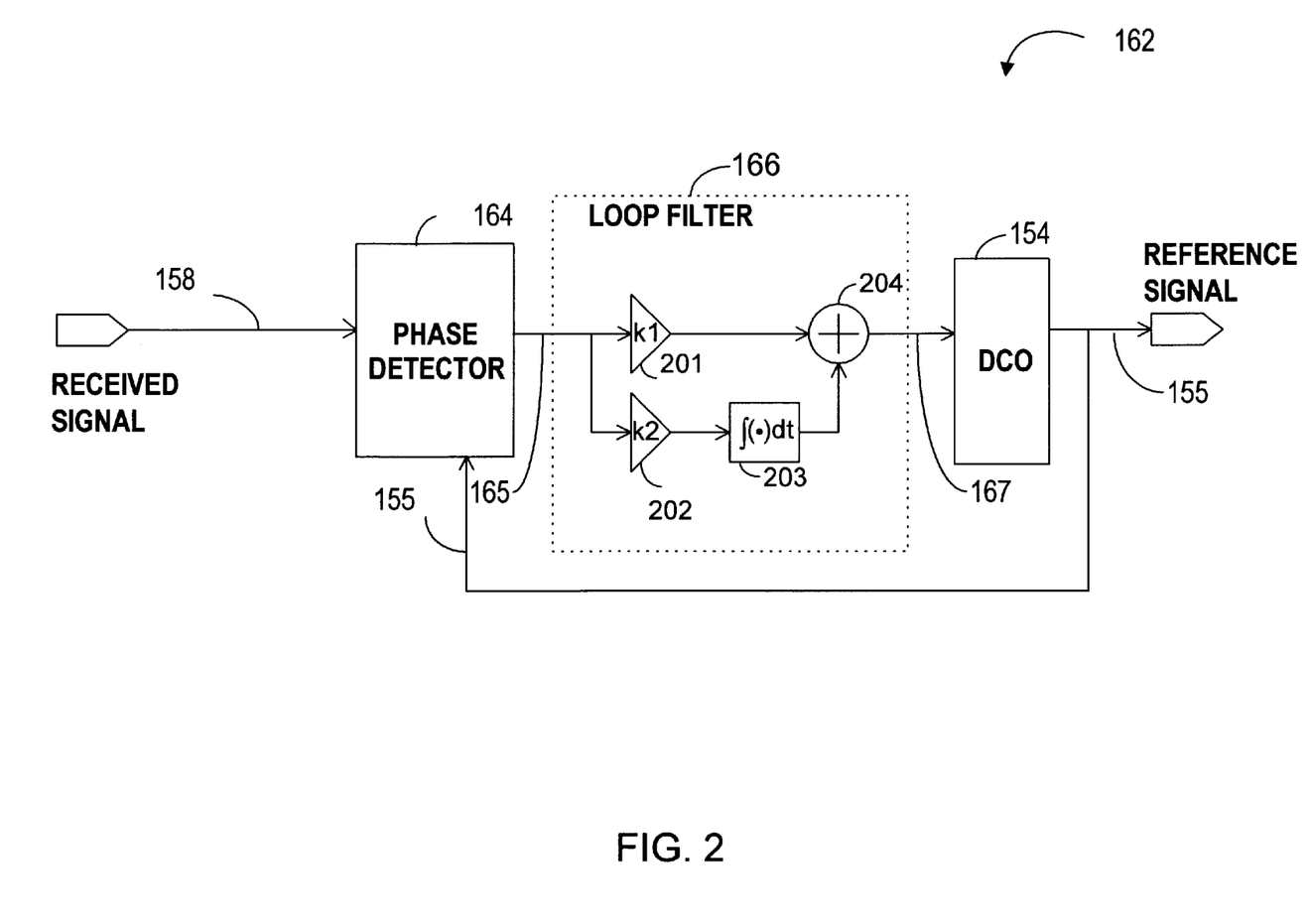
FIG. 2 shows the carrier-recovery loop of the receiver in FIG. 1.

FIG. 2 shows an embodiment of the carrier-recovery loop 162. The phase detector 164 receives the received signal 158 and the receiver reference signal 155. With these two inputs, the phase detector 164 compares the receiver oscillator's phase to the phase of the carrier wave and generates a digital phase error signal 165 indicative of the phase shift between them. The phase error signal 165 is then provided to the loop filter 166 which comprises a novel configuration as described below. The loop filter 166 uses digital processing elements to condition the phase error signal 165 to generate a feedback signal 167; this feedback signal is fed back to the digitally controlled receiver oscillator 154 to nullify its offset from the carrier frequency.

In the implementation of the carrier-recovery loop presented in this figure, the digital feedback signal is fed back to the receiver oscillator 154, which produces the receiver reference signal 155. The receiver reference signal 155 is made available to the phase detector for comparison with the received signal 158.

The Loop Filter

As shown in FIG. 2, the loop filter 166 comprises a multiplier 201 with a gain coefficient k1, which receives the phase error signal 165 and provides an output to a digital adder 204. The loop filter 166 also comprises a multiplier 202 with a gain coefficient k2, which receives the phase error signal 165 and provides an output to an integrator 203 in the loop filter. The integrator 203 in turn provides an output to the digital adder 204. The digital adder 204 provides the sum of its two inputs to the receiver oscillator 154.

The gain coefficients k1 and k2 in multipliers 201 and 202 are adjustable binary values stored in a memory 210.

The integrator 203 accumulates the value of the phase error signal 165 after it has been scaled by the gain coefficient k2 in multiplier 202. The digital adder 204 combines this integrated signal with a version of the original phase error signal that has been scaled by the gain coefficient k1 in multiplier 201. Thus the complex-frequency transfer function of the loop filter is $k_1+k_2/s$. With this implementation of the loop filter, the complex-frequency transfer function $H_\theta(s)$ for the full carrier-recovery loop is given by the following equation.

$$H_\theta(s) = \frac{\Phi(s)}{\Theta(s)} = \frac{sk_1 + k_2}{s^2 + sk_1 + k_2} \qquad \text{Eq. 1}$$

Here $\Phi(s)$ represents the phase of the receiver oscillator (in the complex-frequency domain), and $\Theta(s)$ represents the phase of the received signal 158. The PLL thus has a low-pass response to changes in input frequency. The time constant for its response is determined by the gain coefficients k1 and k2. Since the gain coefficients are binary values stored in the memory 210, they can be adjusted to put the carrier-recovery loop into one of several different operating modes. In the present invention, the receiver has three operating modes: acquisition, tracking, and hold.

To enter the acquisition mode, the receiver sets these coefficients to the appropriate acquisition values each time the receiver begins carrier recovery. In acquisition mode, the PLL of the preferred embodiment has a low-pass response to input frequency change. The receiver changes from the acquisition to tracking mode by reprogramming the gain coefficients k1 and k2 in the loop filter to lower values that are appropriate when the oscillator is close in frequency to the received signal. In tracking mode, the values of k1 and k2 are reduced so that the PLL slows its response time, thereby reducing its sensitivity to high-frequency noise.

This change from acquisition mode to tracking mode occurs when the receiver oscillator is determined to be adequately matched to the frequency of the received signal. There are several possible criteria for changing between these modes. One criterion for making this switch from acquisition mode to tracking mode is that the recovered frequency should be within a set range (typically 1 kHz) of the actual input frequency. A second requirement is useful in systems that receive digital data In these systems, the switch to tracking mode can be additionally delayed until the receiver has acquired a frame synchronization with the received signal.

In hold mode the receiver oscillator is not allowed to adapt, so that it continues to produce its last known frequency. This mode is used to sustain the appropriate frequency during fades in the received signal. In this mode the gain coefficients k1 and k2 have values of zero. Alternatively, this mode can be accomplished by holding the value of the digital feedback signal constant or by forcing the (phase error) input to the loop filter to zero. The latter means can be used to conserve power in TDD (time-division duplex) communication systems. It allows the clock to the multipliers for k1 and k2 and the integrator to be stopped during the transmit portion of the TDD frame, reducing their power requirements by up to a factor of two.

Figure 3:
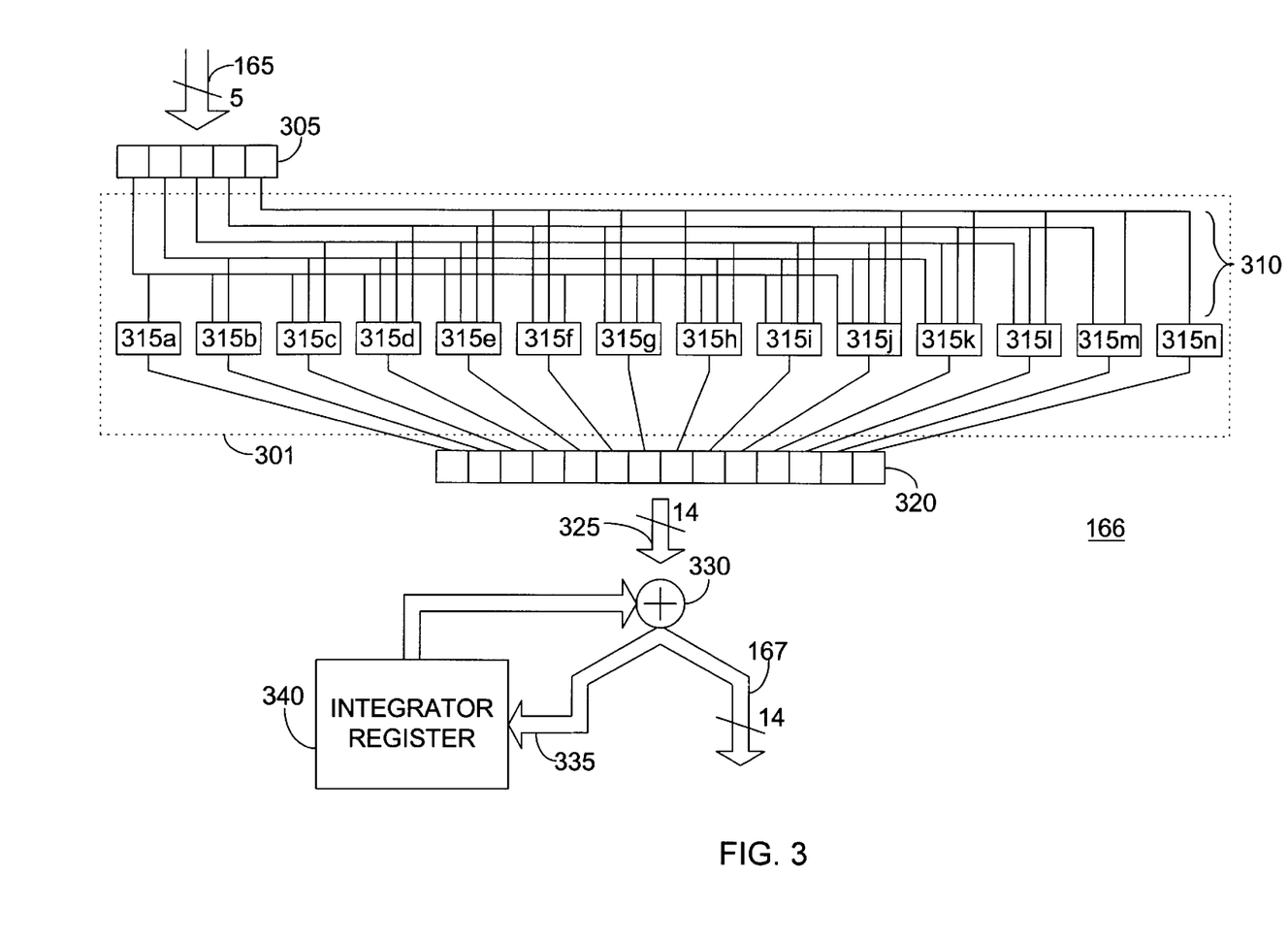
FIG. 3 is a block diagram of one embodiment of the loop filter in the carrier-recovery loop of FIG. 2.

The block diagram in FIG. 3 shows an implementation of the preferred embodiment of the loop filter 166. In this implementation, an input register 305 receives a 5-bit number representing the digital phase error signal 165. The bits of this number are sent to a multiplier 301 that multiplies them by the gain coefficients k1 and k2. Since these gain coefficients are powers of 2, the multiplier works by shifting the input by an appropriate number of bits, as described below, to generate a 14-bit product 325 in an output register 320. The multiplier alternates between using k1 and k2 to multiply the phase error signal 305, so the product 325 represents the phase error multiplied by k1 on one clock cycle, and then the phase error multiplied by k2 on the next clock cycle.

The product 325 is sent to a time-multiplexed adder 330 that alternates its function from cycle to cycle. During a cycle in which it receives the product of k1 and the phase error signal from the multiplier 301, it adds this product to a value that it receives from an integrator register 340. The resulting sum is a 14-bit number representing the feedback signal 167, which is the output of the loop filter. On alternate cycles, the time-multiplexed adder 330 receives the product of k2 and the phase error signal from the multiplier 301. During these cycles it adds the product to the value it receives from an integrator register 340; this sum 335 is then sent back to the integrator register 340 and is stored there. This implementation realizes the function of the loop filter 166 that was described in the discussion of FIG. 2.

When the carrier recovery loop is in the hold mode, the input register is simply set to contain all zeroes, regardless of the value of the phase error 165. The resulting feedback signal 167 is then also zero, as required for the hold mode. For the other two modes, tracking and acquisition, the multiplier multiplies the phase error signal 165 by the appropriate values of k1 and k2.

The multiplier 301 is implemented by the connections and elements contained in the dashed box in FIG. 3. The five bits in the input register 305 are sent via a set of connections 310 to fourteen selection units 315a–n. These selection units are each coupled to one of the bits in the multiplier's output register, and they each copy either one of the bits from the input register or a zero into their corresponding bit in the output register. The different selection units are configured so that the output register receives a copy of the bits in the input register, but shifted by the appropriate number of places according to the multiplier (k1or k2).

Figure 4:
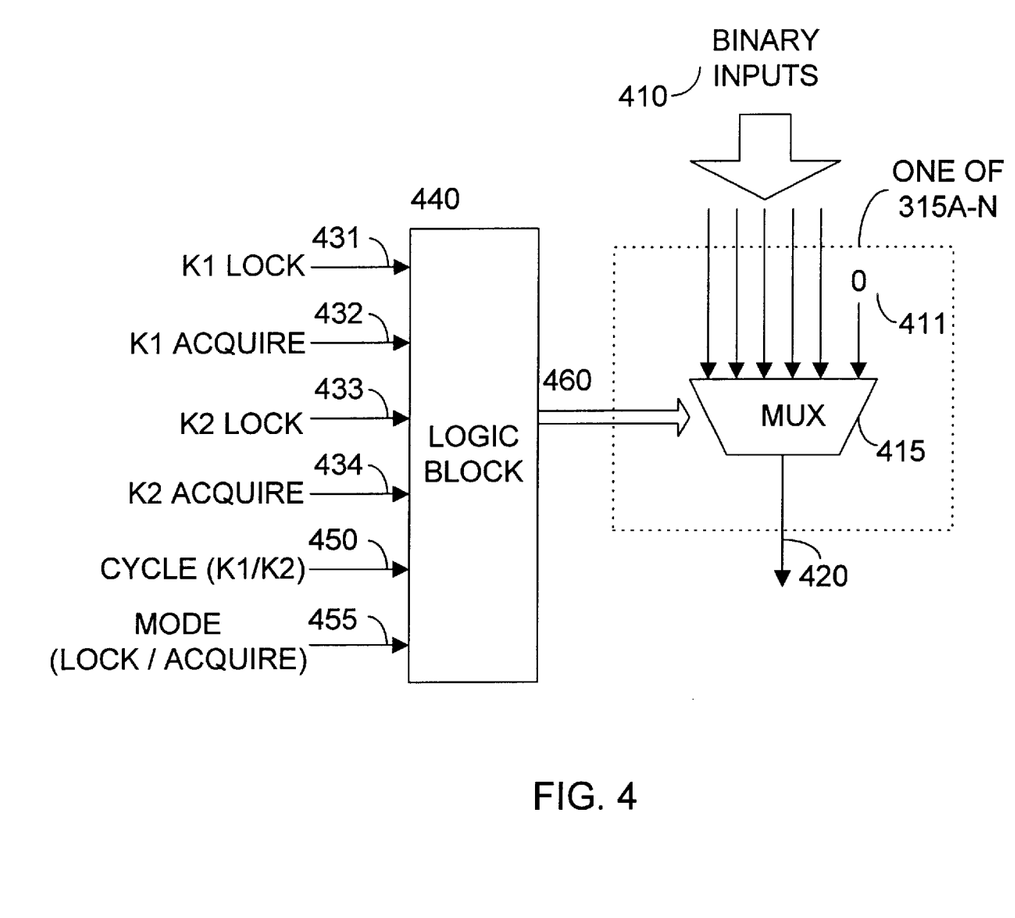
FIG. 4 is a block diagram of a selection unit in the loop filter of FIG. 3.

FIG. 4 presents a more detailed block diagram of the selection units 315a–n in the multiplier 301. As described earlier, each selection unit receives one or more bits from the input register 305 via the a set of connections 310. In this figure, these bits are shown as the binary inputs 410 for one of the selection units. The inputs are sent to a multiplexer 415 which selects one of them, or a zero 411, as the selection unit's output 420. This output is sent to one of the bits in the multiplier's output register (as was shown in FIG. 3).

A logic block 440 controls the multiplexers 415 in the selection units 315a–n by generating a shift code 460 that determines which of the binary inputs 410 is selected by each multiplexer 415. The logic block 440 chooses which input bit is selected by the multiplexer so that the multiplier output register 320 receives an appropriately shifted copy of the input register 305.

To determine the number of places by which the multiplier input 165 should be shifted, the logic block receives the four different values of the multiplier: the value of k1 for lock mode 431, the value of k1 for acquisition mode 432, the value of k2 for lock mode 433, and the value of k2 for acquisition mode 434. These values are pre-programmed into a memory as appropriate for the different modes. Another input 450 to the logic block 440 indicates the cycle in the time-multiplexing; that is, whether k1 or k2 is being used as a multiplier. The logic block 440 also has an input 455 that indicates the operating mode of the carrier recovery loop: lock or acquisition. These two inputs 450 and 455 determine which of the four multiplier values 431–434 is used by the logic block 440. With this multiplier value, the logic block 440 generates the shift code 460 and provides it to the multiplexer 415. In response to the shift code 460, the multiplexer 415 selects one of the input bits 410 from the input register 305 or a zero 411 as the selection unit output 420 that is sent to the corresponding bit of the multiplier output register 320.

In this preferred embodiment, the output of the logic block 440 indicates the shift code, that is, the number of bits to shift the input value 165 stored in register 305. The logic needed in block 440 to generate the shift code is easily implemented by one skilled in the art of logic design, and the multiplexer arrangement is well known as a "shifter" or "barrel shifter"The constraint that each of k1 and k2 be a power of 2 allows the shifter to function as a multiplier. This embodiment of the invention utilizes factors k1 and k2 that are less than 1, thus negative powers of 2 (k1, k2=$2^n$; n=−1, −2, −3, . . . ). However, in another embodiment of the present invention, the factors k1 and k2 can also take values that are greater than or equal to 1 (k1, k2=$2^n$; n=0,±1,±2, ±3, . . . ), and the shift are chosen appropriately.

Figure 5:
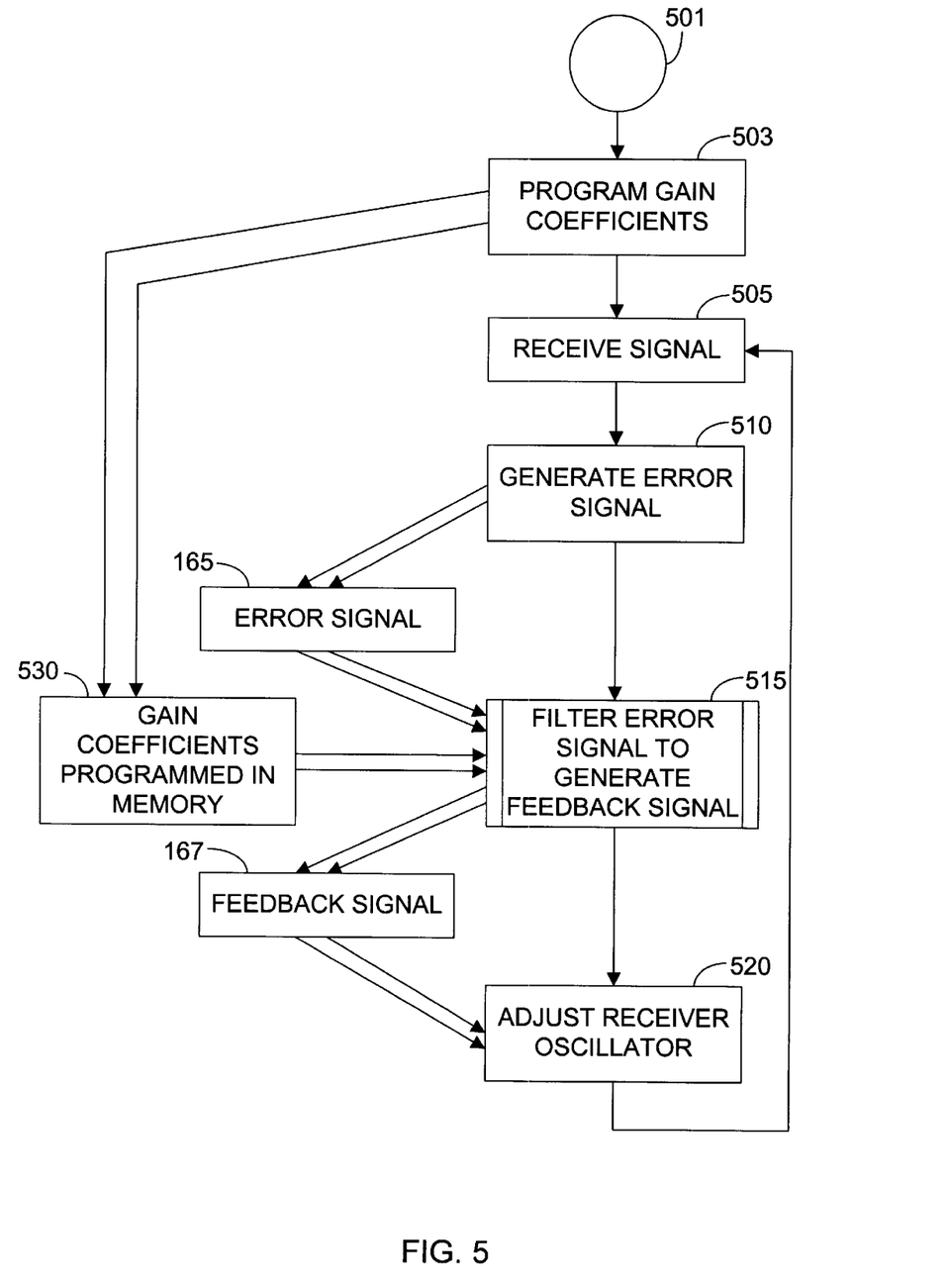
FIG. 5 is a flowchart for the carrier-recovery loop of FIG. 2.

The sequence of steps which constitute the carrier recovery are illustrated by the flowchart in FIG. 5. In this diagram, the bold blocks and flow-lines on the right indicate the steps and the flow between them, while the light boxes on the left indicate quantities that are calculated and used in these steps. From the starting conditions 501, the first step 503 is to program the appropriate gain coefficients for the current operating mode into the memory 210. The next step is to receive the received signal 505. The error signal 165 representing the offset of the receiver oscillator 154 (shown in FIG. 1 and FIG. 2) is generated in the next step 510. The error signal 165 is filtered in the following step 515 according to the gain coefficients k1 and k2 received from memory 530. This filtering step 515 generates the feedback signal 167 that is used in the next step 520 to adjust the receiver oscillator so that it better matches the received signal. After this adjustment, the recovery loop returns to its initial step 505 to repeat the procedure with a new sample of the received signal.

Figure 6:
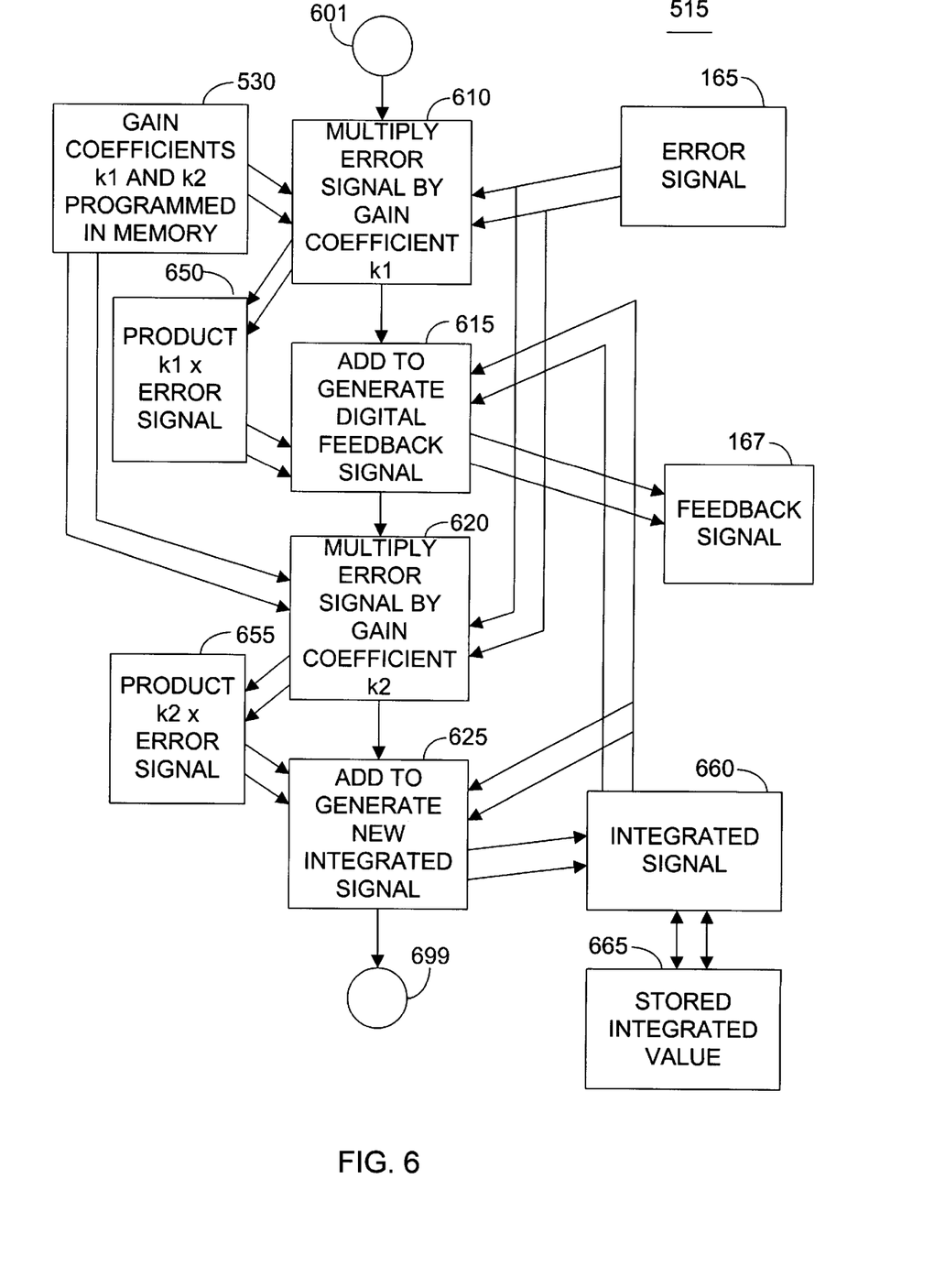
FIG. 6 is a flowchart describing the loop filter of FIG. 3.

The step 515 of filtering the error signal is expanded in FIG. 6. Here the bold blocks and flow-lines in the middle of this figure indicate the filtering steps and the flow between them, while the light boxes on the left and right indicate quantities that are calculated and used in these steps. The start of the filtering procedure 601 is right after the error signal has been generated 510 (as was shown in FIG. 5). In the first step 610 of the filtering procedure the error signal 165 is multiplied by the gain coefficient k1 received from memory 530 to generate the product 650 of these two quantities. The product 650 is then added in the next step 615 with a signal 660 representing the integral of the error signal 165 multiplied by the gain coefficient k2. The resulting sum is the digital feedback signal 167, which is the output of the filtering procedure 515.

To update the integrated signal 660, the next step 620 in the filtering procedure 515 multiplies the error signal 165 with the gain coefficient k2 received from memory 530. The resulting product 655 is then added 625 to the integrated signal 660. The resulting sum, which represents the incremented value of the integrated signal 660, replaces the old value of the integrated signal 660.

Having thus generated an updated value for the feedback signal 167 and the integrated signal 660, the filtering procedure comes to a termination 699, and the carrier recovery of FIG. 5 proceeds to adjust the receiver oscillator in step 520.

Digital Compensation of TDD Frequency Pulling

In one embodiment of the invention, the integrated signal 660 is stored in a memory 665 (shown in FIG. 6) which then holds a stored integrator value. The value in this memory 665 is then used to as an initializing value for the integrated signal 660. The memory 665 is operable to provide its value back to the integrated signal 660 when the carrier recovery loop begins to acquire a new phase lock. This feature of storing the integrated signal 660 in a memory 665 is especially useful in carrier recovery loops that are incorporated into some time-division duplexing (TDD) or time-division multiple access (TDMA) transceivers, in which a unit alternates between receiving and transmitting data. It is a well-known problem in TDD and TDMA radio architecture to have frequency shifts in reference oscillators between transmission and reception modes. This frequency pulling occurs due to operating differences between the transmission and reception modes, such as changes in the output impedance of a reference oscillator.

Figure 7A:
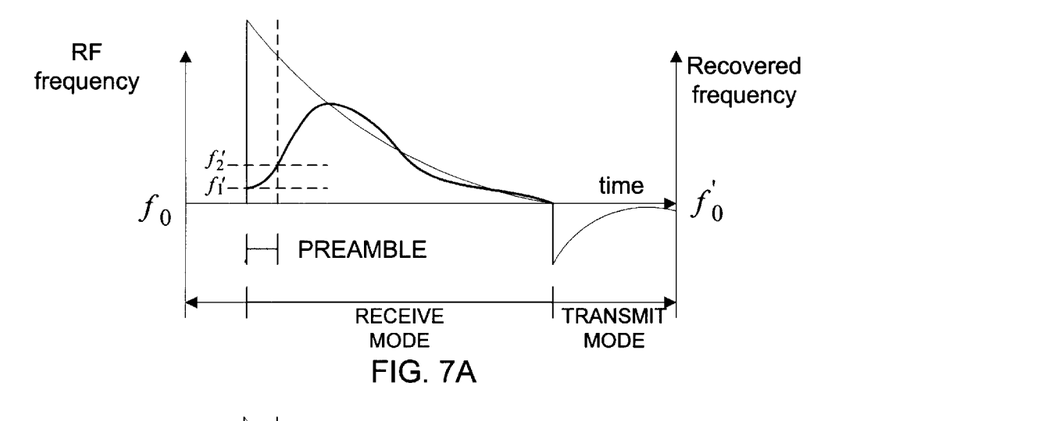
FIG. 7 shows graphs of frequency shifts in a transceiver's oscillator upon switching between transmit and receive, and the resulting frequency response of a carrier-recovery loop.

In another embodiment of the invention, the receiver 150 and the RF demodulator 196 from FIG. 1 are incorporated in a TDD radio transceiver along with a local transmitter and a local RF modulator. In this embodiment, an RF oscillator in the RF demodulator 196 is used to demodulate the RF signal 194 during reception, and is also is used by the local RF modulator to generate an RF carrier during transmission. The frequency of this oscillator undergoes transient frequency shifts as shown in FIG. 7a. In this graph, the RF oscillator frequency is plotted versus time over the duration of a TDD iframe. The vertical axis on the left of the figure indicates a center RF value $f_0$. In this embodiment, the oscillator frequency, shown by the light curve, has a rapid positive jump when the transceiver begins to receive data. The RF oscillator frequency gradually returns to $f_0$, then suffers a rapid negative jump as the transceiver switches to transmit data, and again gradually returns to $f_0$. This pulling of the RF oscillator frequency can lead to significant data losses if it is not compensated, since the large frequency shifts place significant demands on the carrier-recovery loop 162. If the carrier recovery loop fails to track the frequency shifts for a portion of the data reception, the received data will be lost for that portion of the reception. Traditionally, this pulling has been compensated by RF design modifications of the RF demodulators 162 in the prior art. However, in this embodiment of the invention, the stored integrator value in the memory 665 can be used to remedy the effects of the RF frequency pulling.

The heavy curve in FIG. 7a illustrates an example of the recovered frequency for the DCO 154 in this TDD embodiment of the invention. The recovered frequency is at an intermediate frequency (IF) that is lower than the frequency of the RF signal 194, but variations in the RF oscillator frequency lead to corresponding variations in the recovered frequency. The vertical axis for the recovered frequency is on the right in the figure. The center value $f_0'$ on this axis indicates the corresponding phase-locked recovered frequency when the RF oscillator is at $f_0$. Variations in the RF oscillator lead to a corresponding hertz-for-hertz variation in the locked recovered frequency. Thus, on this graph, the heavy curve showing the recovered frequency would lie on top of the light curve showing the RF oscillator frequency if the carrier-recovery loop 162 were ideally tracking the frequency-pulling of the RF oscillator. This would not, however, be the optimal condition for carrier recovery, since if the loop 162 is fast enough to track such a large sudden shift, then it may be too susceptible to high-frequency noise to maintain an adequate lock.

Figure 7B:
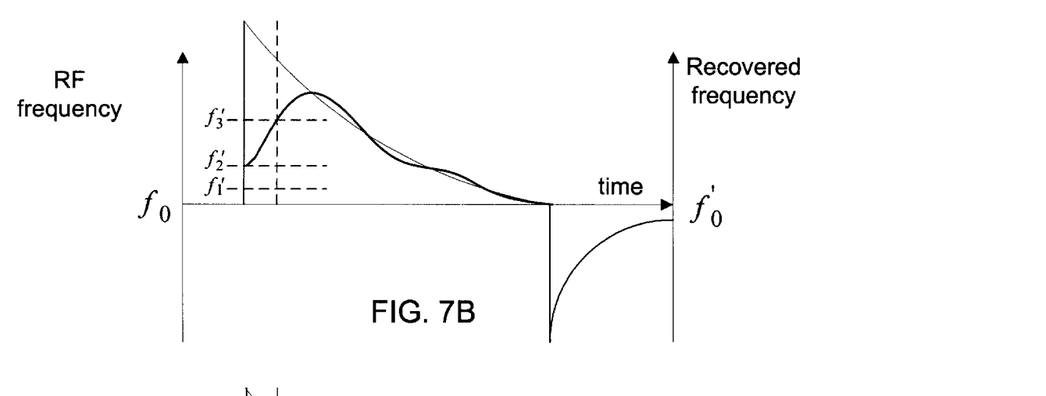
Figure 7C:
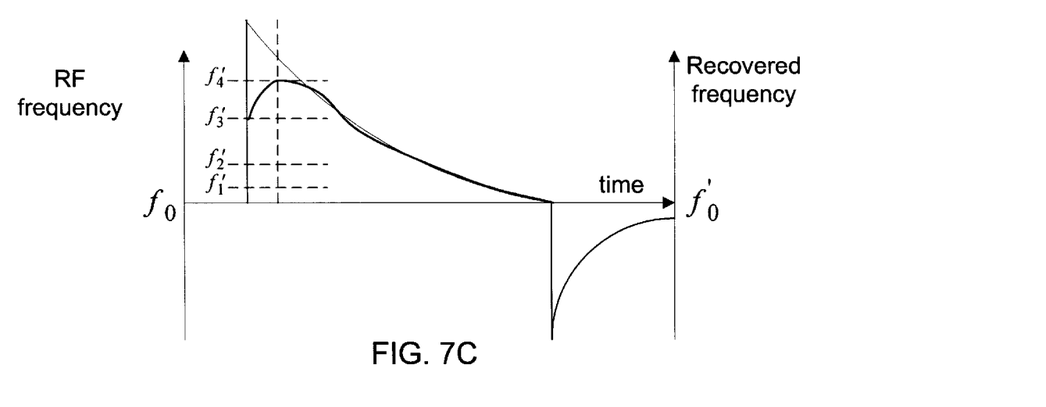

Instead, this TDD embodiment of the invention uses the digital word stored in the memory 665 to mitigate the effects of TDD frequency pulling. As shown by the heavy curve in FIG. 7a, over the duration of a TDD frame, the recovered frequency starts at some initial value $f_1'$ and may have a significant offset from the received signal as the carrier-recovery loop attempts to match the sudden change in received frequency. The TDD frames are structured so that no payload data are transmitted during the initial portion of each transmitted data frame. This portion, called the preamble, is used to allow feedback loops to settle during the initial reception of a data frame. At the end of the preamble, the recovered signal has come closer to its target value (of lying on top of the RF oscillator curve). The exact curve followed by the recovered frequency depends on the form of the frequency pulling and on the response characteristics of the carrier recovery loop 162. The recovered frequency $f_2'$ at the end of the preamble is stored in memory 665 and is used as the initializing value for the recovery frequency at the beginning of the next received frame. As shown in FIG. 7b, by starting from this improved initial value $f_2'$, the carrier-recovery loop more quickly approaches a phase lock during the second received frame. At the end of the preamble in the second received frame, the memory 665 stores a further-improved approximation $f_3'$ of the starting recovered frequency. This new approximation is used in the following frame, as shown in FIG. 7c. Thus by building on values previously stored in memory 665, the carrier-recovery loop 162 converges on a good initializing value for the start of a received data frame. This initializing value allows the carrier-recovery loop 162 to maintain a tight lock with the received signal 158 despite the transient frequency jumps in the RF oscillator of the RF demodulator 196.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. A communications receiver, comprising:
   an input that receives a received signal;
   a carrier recovery loop coupled to said input, wherein said carrier recovery loop receives the received signal and generates a reference signal therefrom, the carrier recovery loop comprising:
      an oscillator that generates the reference signal, and
      a loop filter coupled to said oscillator,
         wherein said loop filter is operable to place said carrier recovery loop in one of a plurality of operating modes in response to one or more gain coefficients, and
         wherein the plurality of operating modes includes a hold mode, wherein in the hold mode the oscillator holds the reference signal at a fixed frequency;
   a memory coupled to said loop filter, wherein said memory stores a first set of one or more gain coefficients for the hold mode,
   wherein said memory is operable to provide the first set of one or more gain coefficients to said loop filter to place the carrier recovery loop in the hold mode.

2. The receiver of claim 1,
   wherein said memory stores a plurality of sets of one or more gain coefficients, wherein the plurality of sets of gain coefficients includes the first set of one or more gain coefficients;
   wherein each said set of one or more gain coefficients in the plurality of sets of one or more gain coefficients corresponds to one of the operating modes in the plurality of operating modes.

3. The receiver of claim 1,
   wherein said memory stores a plurality of sets of one or more gain coefficients, wherein the plurality of sets of one or more gain coefficients includes the first set of one or more gain coefficients;
   wherein each said set of one or more gain coefficients in the plurality of sets of one or more gain coefficients corresponds to one of the operating modes in the plurality of operating modes;
   wherein the receiver is operable to select the one or more gain coefficients provided from said memory to said loop filter, thereby selecting one of the plurality of operating modes of the carrier-recovery loop.

4. The receiver of claim 1,
   wherein said carrier recovery loop farther comprises:
      a phase detector coupled to said input, to said oscillator, and to said loop filter,
      wherein said phase detector receives the received signal from said input, wherein said phase detector receives the reference signal from said oscillator, wherein the phase detector generates a phase error signal indicative of a phase difference between the received signal and the reference signal,
      wherein said loop filter receives the phase error signal from said phase detector and generates a feedback signal in response to the phase error signal and the one or more gain coefficients, and
      wherein said oscillator receives the feedback signal from said loop filter and generates the reference signal in response to the feedback signal.

5. The receiver of claim 4, wherein the one or more gain coefficients are each powers of two and wherein the phase error signal is a digital signal;
   wherein said loop filter comprises:
      one or more multipliers coupled to said phase detector and to said memory, wherein each of said one or more multipliers receives the phase error signal from said phase detector and a gain coefficient from said memory;
   wherein each of said one or more multipliers multiplies the phase error signal by the gain coefficient by shifting the phase error signal by a number of bits indicated by the gain coefficient, thereby generating a multiplier output;
   wherein said loop filter generates the feedback signal in response to the one or more multiplier outputs.

6. The receiver of claim 4, wherein said memory stores a first gain coefficient and a second gain coefficient, and wherein said loop filter further comprises:
   a first multiplier coupled to said phase detector and to said memory that receives the phase error signal from said phase detector and the first gain coefficient from said memory, wherein said first multiplier multiplies the phase error signal by the first gain coefficient to generate a first product;
   a second multiplier coupled to said phase detector and to said memory that receives the phase error signal from said phase detector and the second gain coefficient from said memory, wherein said second multiplier multiplies the phase error signal by the second gain coefficient to generate a second product;
   an integrator coupled to the second multiplier that receives the second product and integrates the second product to generate an integrated signal; and
   an adder that adds the first product and the integrated signal to generate the feedback signal.

7. The receiver of claim 6, wherein the phase error signal is a digital signal comprising a plurality of phase error bits, wherein the bits are a binary representation of the phase error signal, wherein the first and second gain coefficients are each powers of two, and wherein said first and second multipliers operate by shifting the phase error signal and integrated signal by an appropriate number of bits.

8. The receiver of claim 1, wherein one or more of the gain coefficients in said first set of one or more gain coefficients is zero.

9. The receiver of claim 1, wherein said loop filter generates a feedback signal and said oscillator generates the reference signal in response to the feedback signal;
   wherein said memory stores a plurality of sets of one or more gain coefficients, wherein the plurality of sets of one or more gain coefficients includes the first set of one or more gain coefficients, wherein each said set of one or more gain coefficients in the plurality of sets of one or more gain coefficients corresponds to one of the operating modes in the plurality of operating modes;
   wherein each said set of one or more gain coefficients in the plurality of sets of one or more gain coefficients comprises a first-order gain coefficient k1 and a second-order gain coefficient k2;
   wherein said loop filter comprises:
      a multiplier coupled to said input and to said memory, wherein said multiplier receives the phase error signal from said input,
         wherein during a first cycle time, said multiplier receives gain coefficient k1 from said memory and multiplies the phase error signal by gain coefficient k1 to generate a multiplier output, and wherein during a second cycle time, said multiplier receives gain coefficient k2 from said memory and multiplies the phase error signal by gain coefficient k2 to generate the multiplier output, an adder coupled to said multiplier, wherein said adder receives the multiplier output and an integrated value, wherein during the first cycle time, said adder adds the multiplier output and the integrated value to generate the feedback signal, and wherein during the second cycle time, said adder adds the multiplier output and the integrated value to generate a new integrated value, and an integrator register coupled to said adder, wherein during the first cycle time said integrator register provides the integrated value to said adder, and wherein during said second cycle time said integrator register receives the new integrated value from the adder and replaces the integrated value with the new integrated value.

10. The receiver of claim 9, wherein each gain coefficient in the plurality of sets of one or more gain coefficients is a power of two, wherein the phase error signal and the multiplier output are digital signals, and wherein said multiplier is a shift register that shifts the phase error signal by a number of bits indicated by a gain coefficient from said memory.

11. The receiver of claim 9, wherein each gain coefficient in the plurality of sets of one or more gain coefficients is a power of two, wherein the phase error signal is an M-bit digital signal, wherein the multiplier output is an N-bit digital signal, and wherein said multiplier comprises:

N selection units each coupled to said input, to said memory, and to said adder, wherein said selection units each receive a set of one or more bits from the phase error signal, gain coefficient k1, and gain coefficient k2, wherein during the first cycle time each of said N selection units generate one of the N bits of the multiplier output in response to gain coefficient k1 and the set of one or more bits from phase error signal, and wherein during the second cycle time each of said N selection units generate one of the N bits of the multiplier output in response to gain coefficient k2 and the set of one or more bits from phase error signal.

12. The receiver of claim 11, wherein each of the selection units comprises:

a multiplexer that receives the set of bits from the phase error signal and a control signal, wherein the multiplexer selects one of the set of bits from the phase error signal as the one of the N bits of the multiplier output in response to the control signal;

a logic block coupled to said memory and to said multiplexer, wherein said logic block receives gain coefficient k1 and gain coefficient k2 from said memory, wherein during the first cycle time said logic block generates the control signal in response to gain coefficient k1 and provides the control signal to said multiplexer, and wherein during the second cycle time said logic block generates the control signal in response to gain coefficient k2 and provides the control signal to said multiplexer.

13. The receiver of claim 1, wherein the plurality of operating modes further includes a tracking mode, wherein in the tracking mode the one or more gain coefficients have pre-programmed tracking values to allow the reference signal to track the received signal.

14. The receiver of claim 1, wherein the plurality of operating modes further includes an acquisition mode, wherein in the acquisition mode the one or more gain coefficients have pre-programmed acquisition values to enable the carrier recovery loop to acquire a phase lock with the received signal.

15. The receiver of claim 1, wherein the plurality of operating modes further includes a tracking mode and an acquisition mode, wherein:

in the tracking mode the one or more gain coefficients have pre-programmed tracking values to allow the reference signal to track the received signal; and in the acquisition mode the one or more gain coefficients have pre-programmed acquisition values to enable the carrier recovery loop to acquire a phase lock with the received signal.

16. A carrier-recovery loop that generates a reference signal with a reference frequency substantially equal to a received frequency of a received signal, the carrier-recovery loop comprising:

a signal input that receives the received signal;

a digitally controlled oscillator (DCO) that provides the reference signal at the reference frequency;

a phase detector coupled to said signal input and to said DCO, wherein said phase detector receives the received signal from said signal input, wherein said phase detector receives the reference signal from said DCO, and wherein the phase detector generates a digital phase error signal indicative of a phase difference between the received signal and the reference signal;

a memory that stores one or more gain coefficients; and a loop filter coupled to said phase detector, to said memory, and to the input of said DCO, wherein said loop filter receives the digital phase error signal from said phase detector, receives the one or more gain coefficients from said memory, and operates on the digital phase error signal in response to the one or more gain coefficients to generate a digital feedback signal;

wherein the digital feedback signal is provided to the input of said DCO, and wherein said DCO changes the reference frequency in response to the digital feedback signal;

wherein the one or more gain coefficients are programmable to place the carrier-recovery loop in one of a plurality of operating modes; and wherein the plurality of operating modes includes a hold mode, wherein in the hold mode the one or more gain coefficients have values that prevent the reference signal from changing in response to the received signal.

17. The carer-recovery loop of claim 16, wherein the memory is operable to selectively provide the one or more gain coefficients to said loop filter, thereby selecting one of the plurality of operating modes of the carrier-recovery loop.

18. The carrier-recovery loop of claim 16 or of claim 17, wherein the one or more gain coefficients are each powers of two, wherein said loop filter comprises:

one or more multipliers coupled to said phase detector and to said memory, wherein each of said one or more multipliers receives the digital phase error signal from said phase detector and a gain coefficient from said memory;

wherein each of said one or more multipliers multiplies the digital phase error signal by the gain coefficient by shifting the digital phase error signal by a number of bits indicated by the gain coefficient, thereby generating a multiplier output;

wherein said loop filter generates the digital feedback signal in response to the one or more multiplier outputs from said one or more multipliers.

19. The carrier-recovery loop of claim 16, wherein in the hold mode one or more of the one or more gain coefficients is zero.

20. The carrier-recovery loop of claim 16, wherein the one or more gain coefficients stored in said memory comprise a first-order gain coefficient k1 and a second-order gain coefficient k2;

wherein said loop filter comprises:
a filter input that receives the digital phase error signal;
a multiplier coupled to said filter input and to said memory, wherein said multiplier receives the digital phase error signal from said filter input,
wherein during a first cycle time, said multiplier receives gain coefficient k1 from said memory and multiplies the digital phase error signal by gain coefficient k1 to generate a multiplier output, and
wherein during a second cycle time, said multiplier receives gain coefficient k2 from said memory and multiplies the digital phase error signal by gain coefficient k2 to generate the multiplier output;
an adder coupled to said multiplier, wherein said adder receives the multiplier output and an integrated value,
wherein during the first cycle time, said adder adds the multiplier output and the integrated value to generate the digital feedback signal, and
wherein during the second cycle time, said adder adds the multiplier output and the integrated value to generate a new integrated value; and
an integrator register coupled to said adder,
wherein during the first cycle time said integrator register provides the integrated value to said adder, and
wherein during said second cycle time said integrator register receives the new integrated value from the adder and replaces the integrated value with the new integrated value.

21. The carrier-recovery loop of claim 20, wherein each gain coefficient is a power of two, and wherein said multiplier is a shift register that shifts the digital phase error signal by a number of bits indicated by a gain coefficient from said memory.

22. The carrier-recovery loop of claim 20, wherein each gain coefficient is a power of two, wherein the digital phase error signal is an M-bit signal, wherein the multiplier output is an N-bit signal, and wherein said multiplier comprises:

N selection units each coupled to said input, to said memory, and to said adder, wherein said selection units each receive a set of one or more bits from the digital phase error signal, gain coefficient k1, and gain coefficient k2,
wherein during the first cycle time each of said N selection units generate one of the N bits of the multiplier output in response to gain coefficient k1 and the set of bits from digital phase error signal, and
wherein during the second cycle time each of said N selection units generate one of the N bits of the multiplier output in response to gain coefficient k2 and the set of bits from digital phase error signal.

23. The carrier-recovery loop of claim 16, wherein the plurality of operating modes further includes a tracking mode, wherein in the tracking mode the one or more gain coefficients have pre-programmed tracking values to allow the reference signal to track the received signal.

24. The carrier-recovery loop of claim 16, wherein the plurality of operating modes further includes an acquisition mode, wherein in the acquisition mode the one or more gain coefficients have pre-programmed acquisition values to enable the carrier recovery loop to acquire a phase lock with the received signal.

25. The carrier-recovery loop of claim 16, wherein the plurality of operating modes further includes a tracking mode and an acquisition mode, wherein:
in the tracking mode the one or more gain coefficients have pre-programmed tracking values to allow the reference signal to track the received signal; and
in the acquisition mode the one or more gain coefficients have pre-programmed acquisition values to enable the carrier recovery loop to acquire a phase lock with the received signal.

26. A method for performing carrier recovery in one of a plurality of selectable operating modes, the method comprising:
programming one or more gain coefficients of a loop filter to select one of the plurality of operating modes of the carrier recovery;
receiving a received signal, wherein the received signal has a received frequency; and
locking a reference frequency of a reference signal to the received frequency of the received signal, wherein said locking comprises:
generating a digital phase error signal that represents a phase difference between the received signal and the reference signal,
filtering the digital phase error signal according to the programmed one or more gain coefficients to generate a digital feedback signal, and
adjusting the reference frequency of the reference signal in response to the digital feedback signal so that the reference frequency matches the received frequency;
wherein the plurality of operating modes includes a hold mode wherein in the hold mode the one or more gain coefficients have values that prevent the reference signal from changing in response to the received signal.

27. The method of claim 26, wherein in the hold mode, one or more of the one or more gain coefficients is zero.

28. The method of claim 26, wherein said filtering comprises:
multiplying the digital phase error signal by a first gain coefficient from the one or more gain coefficients to generate a product;
wherein said one or more gain coefficients are each powers of two, wherein said multiplying comprises bit-shifting the digital phase error signal by a number of bits indicated by the first gain coefficient.

29. The method of claim 26, wherein the plurality of operating modes further includes a tracking mode wherein in the tracking mode the one or more gain coefficients have pre-programmed tracking values to allow the reference signal to track the received signal.

30. The method of claim 26, wherein the plurality of operating modes further includes an acquisition mode wherein in the acquisition mode the one or more gain coefficients have pre-programmed acquisition values to enable the carrier recovery loop to acquire a phase lock with the received signal.

31. The method of claim 26, wherein the plurality of operating modes further includes a tracking mode and an acquisition mode, wherein:

in the tracking mode the one or more gain coefficients have pre-programmed tracking values to allow the reference signal to track the received signal; and in the acquisition mode the one or more gain coefficients have pre-programmed acquisition values to enable the carrier recovery loop to acquire a phase lock with the received signal.

32. The method of claim 26, wherein the one or more gain coefficients include a first gain coefficient and a second gain coefficient, wherein said filtering comprises:

a first multiplying of the digital phase error signal by the first gain coefficient to generate a first product;

a second multiplying of the digital phase error signal by the second gain coefficient to generate a second product;

integrating the second product in time to generate a digital integrated signal; and adding the first product and the digital integrated signal to generate the digital feedback signal.

33. The method of claim 32, wherein the digital phase error signal comprises a plurality of phase error bits, wherein the bits are a binary representation of the digital phase error signal, wherein the first and second gain coefficients are each powers of two, wherein said first multiplying and said second multiplying comprise shifting the digital phase error signal by an appropriate number of bits.

* * * * *

UNITED STATES PATENT AND TRADEMARK OFFICE
CERTIFICATE OF CORRECTION

PATENT NO. : 6,018,556
DATED : January 25, 2000
INVENTOR(S) : Janesch et al.

It is certified that error appears in the above-identified patent and that said Letters Patent is hereby corrected as shown below:

Claim 17, col. 14, line 55, please delete "carer-recovery" and substitute --carrier-recovery--.

Signed and Sealed this

Fifth Day of December, 2000

Attest:

Q. TODD DICKINSON

*Attesting Officer*       *Director of Patents and Trademarks*